(12) United States Patent
Hsieh

(10) Patent No.: US 8,722,434 B2
(45) Date of Patent: May 13, 2014

(54) INTEGRATED TRENCH MOSFET WITH TRENCH SCHOTTKY RECTIFIER

(71) Applicant: Force MOS Technology Co., Ltd., Taipei County (TW)

(72) Inventor: Fu-Yuan Hsieh, Banciao (TW)

(73) Assignee: Force MOS Technology Co., Ltd., Banciao (TW)

( * ) Notice: Subject to any disclaimer, the term of this patent is extended or adjusted under 35 U.S.C. 154(b) by 0 days.

(21) Appl. No.: 13/845,747

(22) Filed: Mar. 18, 2013

(65) Prior Publication Data

US 2013/0214350 A1   Aug. 22, 2013

Related U.S. Application Data

(60) Division of application No. 12/659,639, filed on Mar. 16, 2010, now Pat. No. 8,426,913, which is a continuation-in-part of application No. 12/213,628, filed on Jun. 23, 2008, now Pat. No. 7,816,732.

(51) Int. Cl.
*H01L 29/78* (2006.01)
*H01L 29/66* (2006.01)

(52) U.S. Cl.
USPC ............................ 438/27; 257/334

(58) Field of Classification Search
USPC .......................................... 257/334
See application file for complete search history.

(56) References Cited

U.S. PATENT DOCUMENTS

| | | |
|---|---|---|
| 2003/0040144 A1 | 2/2003 | Blanchard et al. |
| 2005/0029585 A1 | 2/2005 | He et al. |
| 2006/0125040 A1 | 6/2006 | Levin et al. |
| 2006/0170036 A1 | 8/2006 | Yilmaz |
| 2008/0246082 A1 | 10/2008 | Hshieh |

*Primary Examiner* — Zandra Smith
*Assistant Examiner* — Lawrence Tynes, Jr.
(74) *Attorney, Agent, or Firm* — Bacon & Thomas, PLLC

(57) ABSTRACT

An integrated circuit comprising trench MOSFET having trenched source-body contacts and trench Schottky rectifier having trenched anode contacts is disclosed. By employing the trenched contacts in trench MOSFET and trench Schottky rectifier, the integrated circuit is able to be shrunk to achieve low specific on-resistance for trench MOSFET, and low $V_f$ and reverse leakage current for trench Schottky Rectifier.

11 Claims, 17 Drawing Sheets

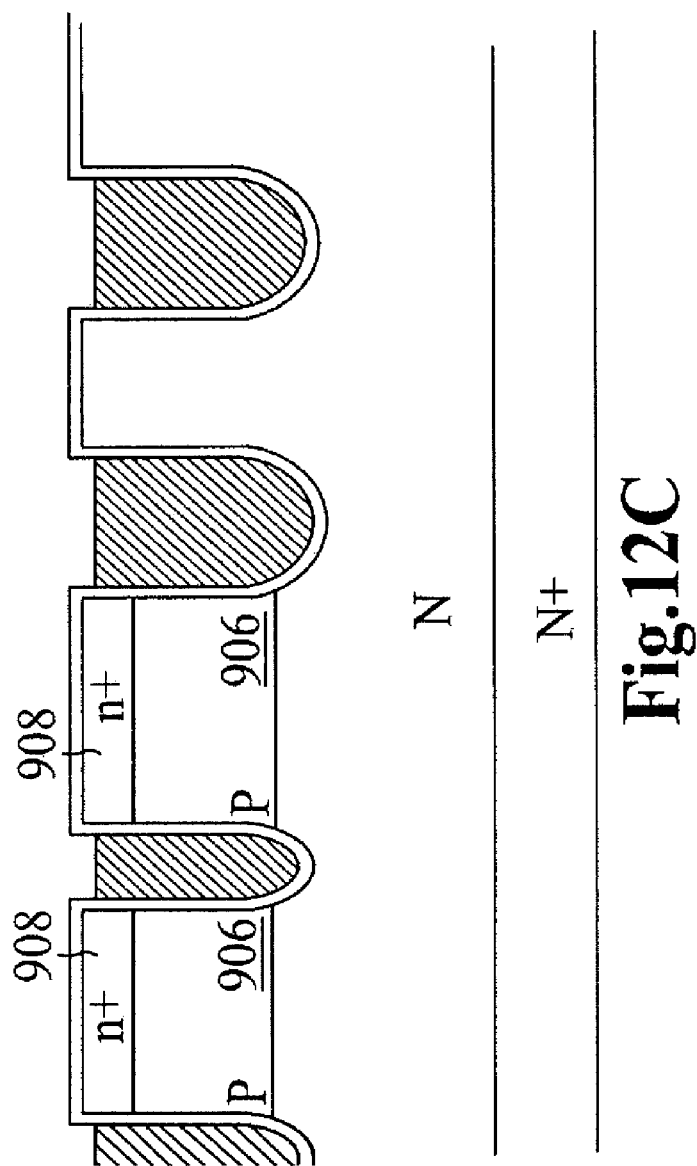

1

INTEGRATED TRENCH MOSFET WITH TRENCH SCHOTTKY RECTIFIER

This application is a divisional application of 12/659,639, which was filed Mar. 16, 2010, now U.S. Pat. No. 8,426,913, which is a Continuation-In-Part of U.S. patent application Ser. No. 12/213,628, now U.S. Pat. No. 7,816,732, patented on Oct. 19, 2010, of the same inventor, filed on Jun. 23, 2008 entitled "Integrated Trench MOSFET and Schottky Rectifier with Trench Contact structures" which is hereby incorporated by reference.

FIELD OF THE INVENTION

This invention related generally to the cell structure and device configuration of semiconductor devices. More particularly, this invention relates to an improved integrated trench MOSFET with trench Schottky rectifier.

BACKGROUND OF THE INVENTION

The trench Schottky rectifiers have been added externally in parallel to a semiconductor power device, e.g. a power trench MOSFET device for higher efficiency DC/DC applications. In parallel with the parasitic PN body diode, the trench Schottky rectifier acts as clamping diode to prevent the body diode from turning on. Therefore, many kinds of configuration have been proposed in prior arts trying to integrate the trench MOSFET and the trench Schottky rectifier on a single substrate.

In U.S. Pat. No. 6,351,018 and No. 6,987,305, configurations are disclosed to integrate trench MOSFET with trench Schottky rectifier on a same single substrate and sharing a common trenched gate. FIG. 1 illustrates one of those in U.S. Pat. No. 6,351,018 wherein the disclosed configuration comprises trench MOSFET 101 and trench Schottky rectifier 110 which both formed on an N doped substrate 102. The disclosed configuration further comprises a plurality of trenched gates 100 and 100-1 formed by refilling doped poly 106 into a plurality of gate trenches lining by a layer of gate oxide 104. Among those said trenched gates, the trenched gates 100-1, as illustrated, are shared by said trench MOSFET 101 and said trench Schottky rectifier 110 as common trenched gates. Furthermore, in portion of said trench MOSFET 101, a plurality of n+ source regions 112 are formed adjacent to the sidewalls of the trenched gates and near the surface of a plurality of P body regions 108. Between a pair of the n+ source regions 112, a P+ body contact region 114 is formed in body region with a higher doping concentration to reduce the contact resistance between the P body region and front metal. Onto a conductive layer 116 in portion of said trench MOSFET 101, and onto another conductive layer 118 in portion of said trench Schottky rectifier 110, front metal layer 120 is formed to short the source regions and the body regions of said trench MOSFET 101, to the anode of trench Schottky rectifier 110 by planar contact.

FIG. 2 shows another integrated configuration disclosed in U.S. Pat. No. 6,593,620 wherein the trench MOSFET 220 and the trench Schottky rectifier 222 have separated trenched gates. Onto an N+ substrate 200 padded by a drain metal 218 on the rear side, the N-channel integrated configuration is formed in an N epitaxial layer 202 and further comprises a plurality of trenched gates 210 and 210-1 which all filled with doped poly 206 padded by a gate oxide layer 204. The portion of said trench MOSFET 220 further comprises P body regions 208 with n+ source regions 212 formed near its top surface and adjacent to the sidewalls of the trenched gates 210. Onto the integrated configuration, front metal 216 is formed covering an insulation layer 214 to short the source region and body region in said trench MOSFET 220, to the anode of said trench Schottky rectifier 222 by planar contact.

Both configuration mentioned above can achieve the integration of the trench MOSFET and the trench Schottky rectifier on a single substrate, but it should be noticed that, planar contacts are employed to contact the source regions and the body regions of said trench MOSFET with the front metal layer, and also to contact the anode of said trench Schottky rectifier with the front metal layer. Especially for said trench MOSFET, the planar contact will limit the device shrinkage because of the large area required by the planar contact, which will result in a high specific on-resistance in said trench MOSFET.

Furthermore, when the dimension of the planar contacts is shrunk, a poor capability of metal stop coverage will be pronounced if single metal is used to fill the planar contacts and to act as front metal.

Accordingly, it would be desirable to provide new and improved integrated configuration to avoid the constraint discussed above.

SUMMARY OF THE INVENTION

The present invention has been conceived to solve the above-described problems with the related art, and it is an object of the invention to provide a technique which makes it possible to integrate trench MOSFET and trench Schottky rectifier on single substrate with low specific on-resistance for trench MOSFET and low Vf (forward voltage) and reverse leakage current for trench Schottky rectifier.

In order to solve the above-described problems, according to a first aspect of the invention, there is provided an integrated circuit comprising a plurality of trench MOSFETs having trenched source-body contacts and a plurality of trench Schottky rectifiers having trenched anode contacts formed on a substrate of a first conductivity type, further comprises: an epitaxial layer of said first conductivity type over said substrate, said epitaxial layer has a lower doping concentration than said substrate; an insulation layer covering top surface of said first epitaxial layer; a drain metal disposed on rear side of said substrate. Each of said trench MOSFETs comprising: a plurality of first trenched gates formed within said epitaxial layer and filled with doped poly padded by a gate oxide layer; a body region of a second conductivity type extending between every two adjacent said first trenched gates and locating into upper portion of said epitaxial layer; a source region of said first conductivity type surrounding each said first trenched gate and locating near upper surface of said body region, said source region has a higher doping concentration than said first epitaxial layer; a plurality of trenched source-body contacts, each of said trenched source-body contact is filled with metal plug and penetrating through said insulation layer, said source region and extending into said body region between every two adjacent of said first trenched gates. Each of said trench Schottky rectifiers comprising: a plurality of second trenched gates formed within said epitaxial layer and filled with said doped poly padded by a gate oxide layer; a plurality of trenched anode contacts, each of said trenched anode contacts is filled with said metal plug and penetrating through said insulation layer and extending into said body region between every two adjacent of said second trenched gates.

According to a second aspect of the present invention, as shown in FIG. 3~FIG. 6, there is provided an integrated circuit further comprises a body contact region of said second conductivity type formed within said body region wrapping the bottom of said trenched source-body contact, and also formed within said first epitaxial layer wrapping the bottom of said trenched Schottky anode contacts in trench Schottky rectifier portion, said body contact region has a higher doping concentration than said body region.

According to a third aspect of the present invention, as shown in FIG. 7~FIG. 11, there is provided an integrated circuit further comprises a body contact region of said second conductivity type formed only within said body region wrapping the bottom of said trenched source-body contact, not formed within said trench Schottky rectifier portion, and said body contact region has a higher doping concentration than said body region.

According to a fourth aspect of the present invention, as shown in FIG. 3, FIG. 4 and FIG. 7~FIG. 11, there is provided an integrated circuit further comprises a plurality of trenched gate contacts within said trench Schottky rectifier portion, each of said trenched gate contact is filled with said metal plug and penetrating through said insulation layer and extending into said second trenched gates having wider trench width than said first trenched gates According to a fifth aspect of the present invention, as shown in FIG. 3, FIG. 4 and FIG. 7~FIG. 11, there is provided an integrated circuit having with the fourth aspect feature further comprises a source metal on top surface of said insulation layer, said source metal is connected to said trenched source-body contacts, said trenched Schottky anode contacts as well as said trenched gate contacts.

According to a sixth aspect of the present invention, as shown in FIG. 5 and FIG. 6, there is provided an integrated circuit further comprises at least a third trenched gate having wider trench width than said first trenched gate and said second trenched gate.

According to a seventh aspect of the present invention, as shown in FIG. 5 and FIG. 6, there is provided an integrated circuit having the sixth aspect feature further comprises at least a trenched gate contact, each of said trenched gate contact is filled with said metal plug and penetrating through said insulation layer and extending into said third trenched gate.

According to an eighth aspect of the present invention, as shown in FIG. 5 and FIG. 6, there is provided an integrated circuit having the sixth aspect feature further comprises a source metal on top surface of said insulation layer, said source metal is connected to said trenched source-body contacts and said trenched Schottky anode contacts.

According to a ninth aspect of the present invention, as shown in FIG. 5 and FIG. 6, there is provided an integrated circuit having the seventh aspect feature further comprises a gate metal on top surface of said insulation layer, said gate metal is connected to said at least a trenched gate contact.

According to a tenth aspect of the present invention, as shown in FIG. 9 and FIG. 10, there is provided an integrated circuit having the third aspect feature further comprises said trenched Schottky anode contacts disposed within a lightly doping region of said first conductivity type in upper portion of said epitaxial layer within said trench Schottky rectifier portion, said lightly doping region has a lower doping concentration than said epitaxial layer. Said lightly doping region is formed by growing additional epitaxial layer on top of said epitaxial layer. Alternatively, said lightly doped region is formed as a counter doping region by performing an ion implantation of a dopant having opposite conductivity to said epitaxial layer into said epitaxial layer and following by diffusions.

According to an eleventh aspect of the present invention, as shown in FIG. 11, there is provided an integrated circuit having the third aspect feature further comprises a Schottky barrier height enhancement region encompassing the sidewall and bottom of said trenched Schottky anode contacts in said Schottky rectifier, having said first conductivity type and a lower doping concentration than said epitaxial layer. Said third aspect feature further comprises an avalanche enhancement region within said body region and encompassing the sidewall of each said trenched source-body contact in said trench MOSFET portion.

According to a twelfth aspect of the present invention, as shown in FIG. 3, FIG. 5, FIG. 7, FIG. 9 and FIG. 11, there is provided an integrated circuit wherein said gate oxide layer is a single oxide layer, and the thickness of said gate oxide layer along bottom of each trenched gate is not greater than that along sidewalls of each trenched gate.

According to a thirteenth aspect of the present invention, as shown in FIG. 4, FIG. 6, FIG. 8, FIG. 10 and FIG. 11, there is provided an integrated circuit wherein the thickness of said gate oxide layer along bottom of each trenched gate is greater than that along sidewall of each trenched gate.

According to a fourteenth aspect of the present invention, there is provided a method of manufacturing an integrated circuit comprising a plurality of trench MOSFETs and a plurality of trench Schottky rectifiers, having the steps of: growing an epitaxial layer with a first conductivity type upon a heavily doped substrate with said first conductivity type; etching a plurality of first gate trenches in said trench MOSFET portion, and a plurality of second gate trenches in said trench Schottky rectifier portion after applying a trench mask; growing a sacrificial oxide layer onto inner surface of said first gate trenches and said second gate trenches and then removing away said sacrificial oxide layer; forming a gate oxide layer along the inner surface of said first gate trenches and said second gate trenches, and along the top surface of said epitaxial layer; depositing doped poly-silicon with said first conductivity type into said first gate trenches and said second gate trenches; etching back said doped poly-silicon to form trenched gates; applying a body mask and carrying out ion implantation with a second conductivity type dopant and then diffusing it to form body regions; applying a source mask and carrying out ion implantation with said first conductivity type dopant and then diffusing it to form source regions; forming an insulation layer covering top surface of said trench MOSFET and said trench Schottky rectifier; applying a contact mask onto said insulation layer; etching a plurality of contact trenches by successively dry oxide etching and dry silicon etching, said contact trenches include: a plurality of source-body contact trenches penetrating through said insulation layer, said source regions and extending into said body regions; a plurality of Schottky anode contact trenches penetrating through said insulation layer and extending into said epitaxial layer between every two adjacent of said second gate trenches; a plurality of gate contact trenches penetrating through said insulation layer and extending into said poly-silicon within said second gate trenches. The method further comprises: applying a body contact mask to cover said Schottky rectifier portion and carrying out ion implantation of zero degree with said second conductivity type dopant to form body contact region with heavier doping concentration than said body region; removing away said body contact mask; carrying out angle ion implantations with BF2 dopant to form said avalanche enhancement region wrapping the sidewall of each said source-body contact trench in trench MOSFET within body region, and to form said Schottky barrier height enhancement region wrapping the sidewall and bottom of each said anode contact trench in trench Schottky rectifier within said epitaxial layer; activating dopant of said body contact region and said Schottky barrier height enhancement region.

In the said above, top surface of said doped poly-silicon in said first trenched gates and said second trenched gates is equal to, or lower than, or higher than that of said epitaxial layer. Moreover, trench sidewalls of said trenched source-body contacts and said Schottky anode contacts are not restricted to be vertical but may be tapered, or combination of vertical and tapered shape.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIGS. 12A~12F are a serial of side cross-sectional views for showing the processing steps for fabricating the trench MOSFET as shown in FIG. 11.

DETAILED DESCRIPTION OF THE EMBODIMENTS

Figure 1:
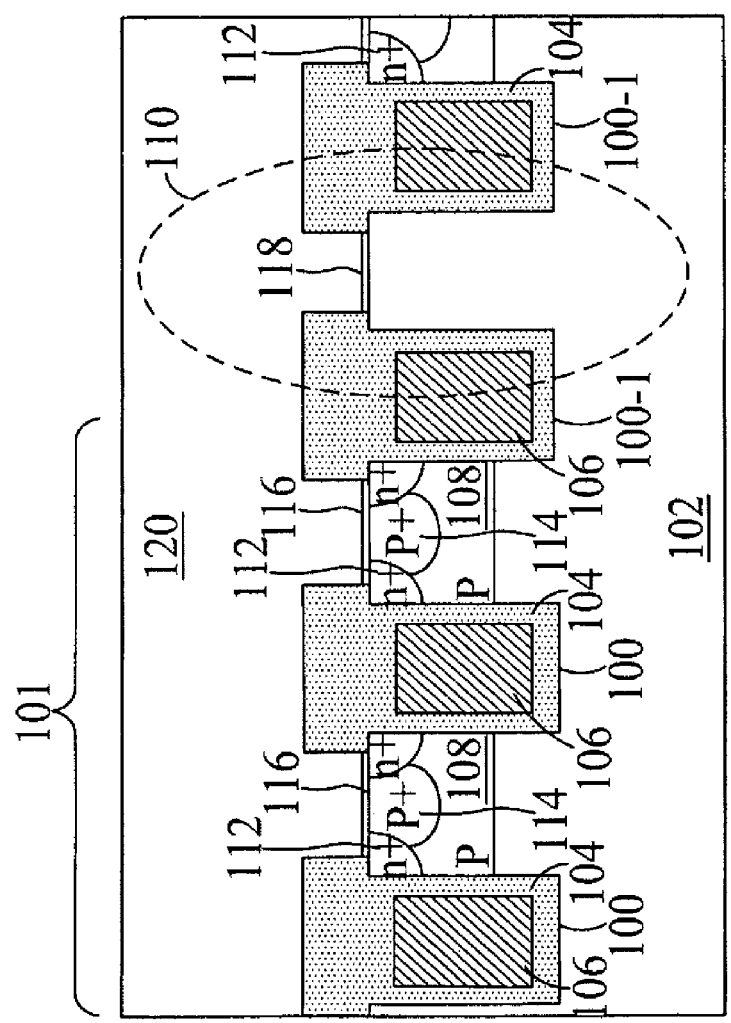
FIG. 1 is a side cross-sectional view of an integrated circuit of prior art.
Figure 2:
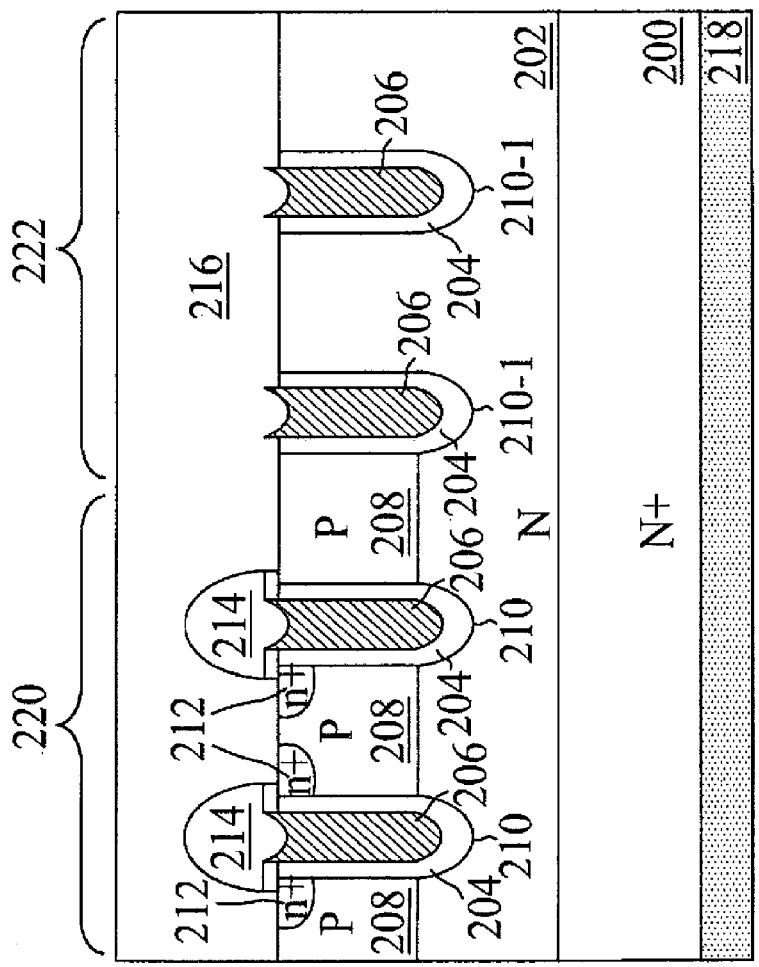
FIG. 2 is a side cross-sectional view of another integrated circuit of prior art.
Figure 3:
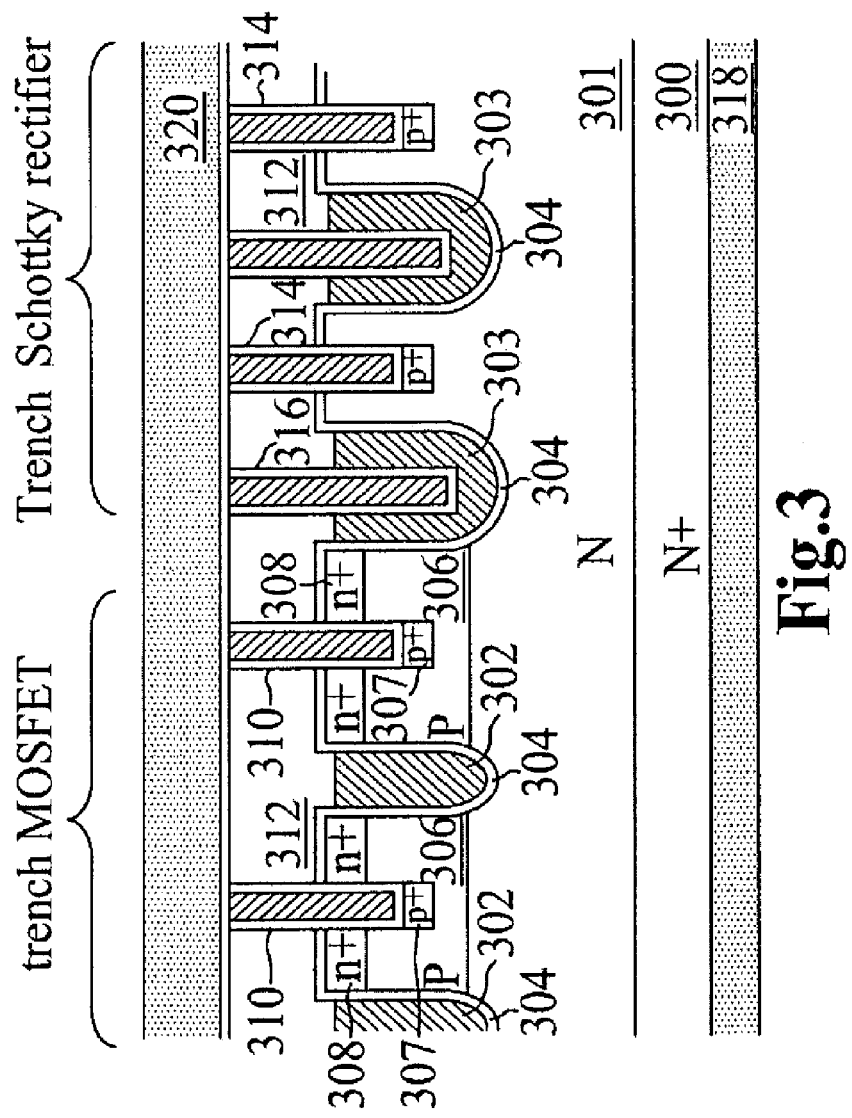
FIG. 3 is a side cross-sectional view of a preferred embodiment according to the present invention.

Please refer to FIG. 3 for a cross sectional view of a preferred N-channel integrated circuit which formed on an N+ substrate 300 with back metal 318 of Ti/Ni/Ag on rear side as drain electrode. Onto said N+ substrate 300, a lighter doped N epitaxial layer 301 is grown, a plurality of first trenched gates 302 filled with doped poly-silicon and a plurality of second trenched gates 303 filled with said doped poly-silicon are all formed within said epitaxial layer 301 and lined by a gate oxide layer 304 along the inner surface. The trench MOSFET portion further comprises: P body regions 306 extending between trenched gates; n+ source regions 308 near the top surface of said P body regions; a plurality of trenched source-body contacts 310 filled with tungsten plugs penetrating through a contact interlayer 312, said source region 308 and extending into said body region 306; a p+ body contact region 307 underneath the bottom of each said trenched source-body contact with heavier doping concentration than said body region. The trench Schottky rectifier portion further comprises: a plurality of trenched Schottky anode contacts 314 filled with said tungsten plugs penetrating through said contact interlayer 312 and extending into said epitaxial layer 310 between a pair of second trenched gates 303; a plurality of trenched gate contacts 316 filled with said tungsten plugs penetrating through said contact interlayer 312 and extending into said second trenched gates. Onto said contact interlayer 312, a source metal 320 is formed padded by a resistance-reduction layer Ti or Ti/TiN underneath to connect said source regions 308, said body regions 306 to the anode of said trench Schottky rectifier. Meanwhile, said second trenched gates 303 in said trench Schottky rectifier are not connected with said first trenched gates 302 in said trench MOSFET but shorted with the anode of said trench Schottky rectifier.

Figure 4:
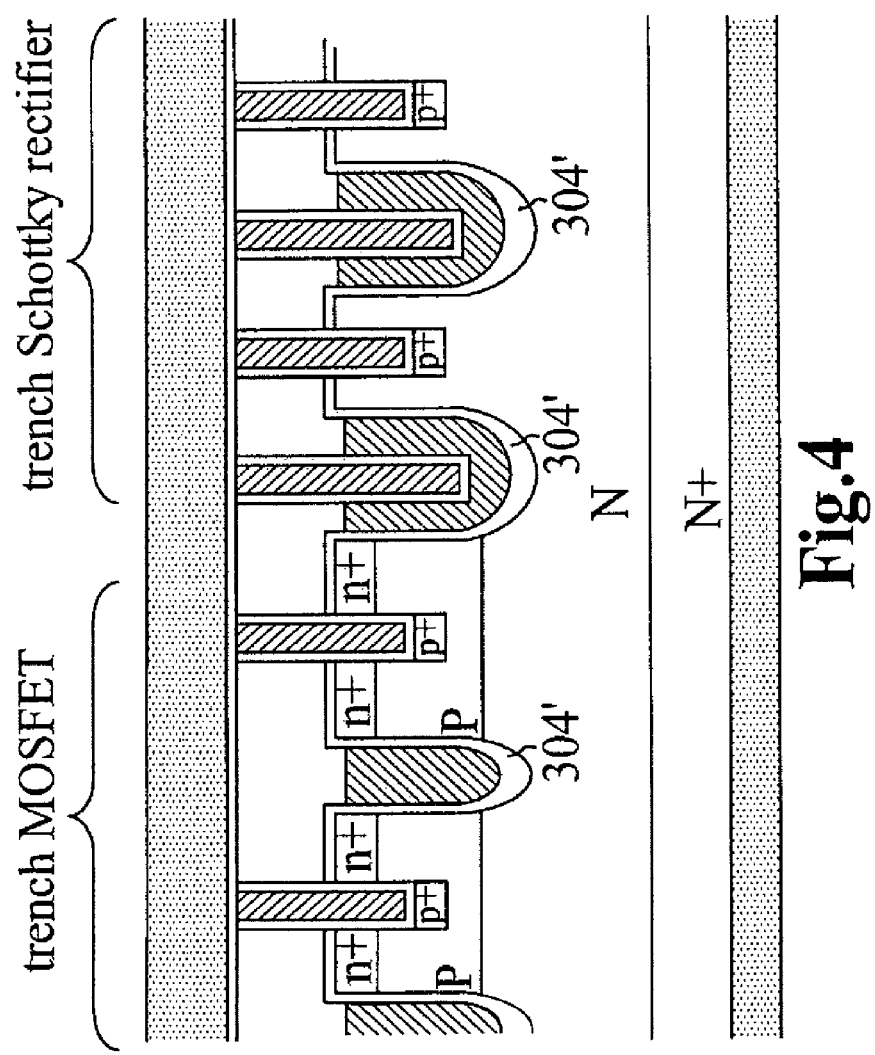
FIG. 4 is a side cross-sectional view of another preferred embodiment according to the present invention.

Please refer to FIG. 4 for a cross sectional view of another preferred N-channel integrated circuit which is similar to that in FIG. 3 except that, the gate oxide layer 304' in FIG. 4 has greater thickness along the bottom of each trenched gate than along the sidewall to achieve a lower gate charge.

Figure 5:
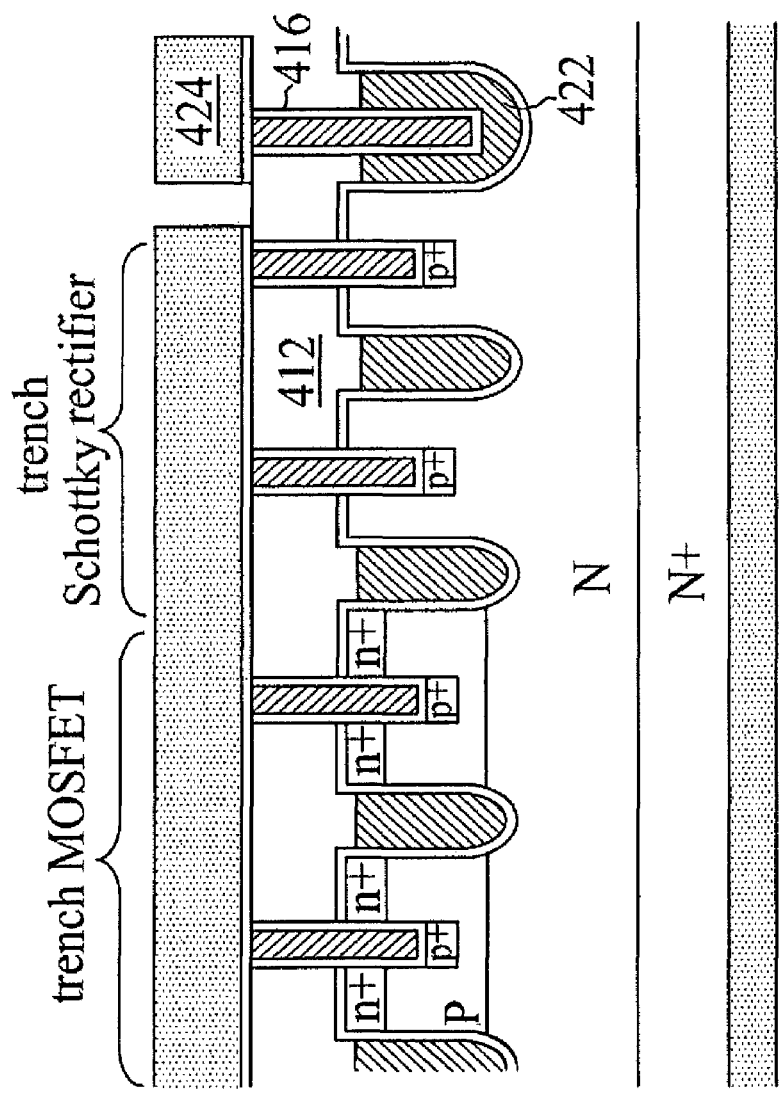
FIG. 5 is a side cross-sectional view of another preferred embodiment according to the present invention.

Please refer to FIG. 5 for a cross-sectional view of another preferred N-channel integrated circuit. Comparing to FIG. 3, the trench MOSFET and trench Schottky rectifier in FIG. 5 share at least common trenched gate which illustrated as a third trenched gates 422. Meanwhile, a trenched gate contact 416 is formed penetrating the contact interlayer 412 and extending into the filling-in doped poly-silicon within said third trenched gate 422 to contact said third trenched gate 422 to a gate metal 424. This also means that, there is no trenched gate contact in said trench Schottky rectifier portion.

Figure 6:
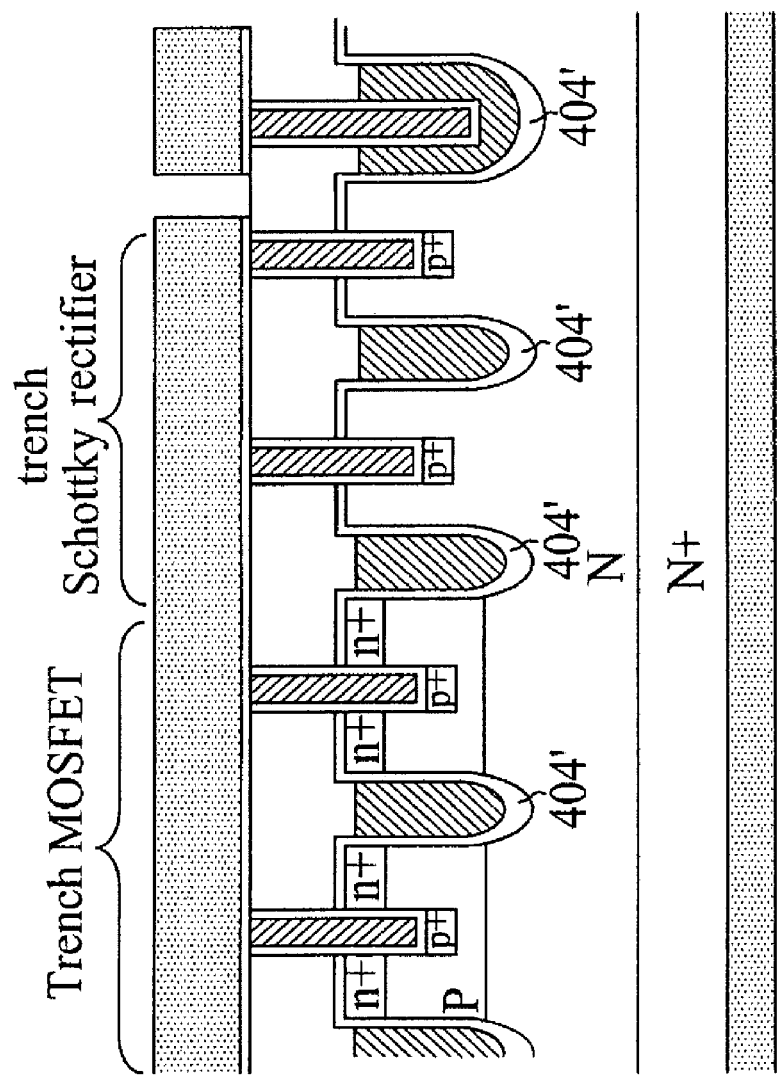
FIG. 6 is a side cross-sectional view of another preferred embodiment according to the present invention.

Please refer to FIG. 6 for a cross sectional view of another preferred N-channel integrated circuit which is similar to that in FIG. 5 except that, the gate oxide layer 404' in FIG. 6 has greater thickness along the bottom of each trenched gate than along the sidewall to achieve a lower gate charge.

Figure 7:
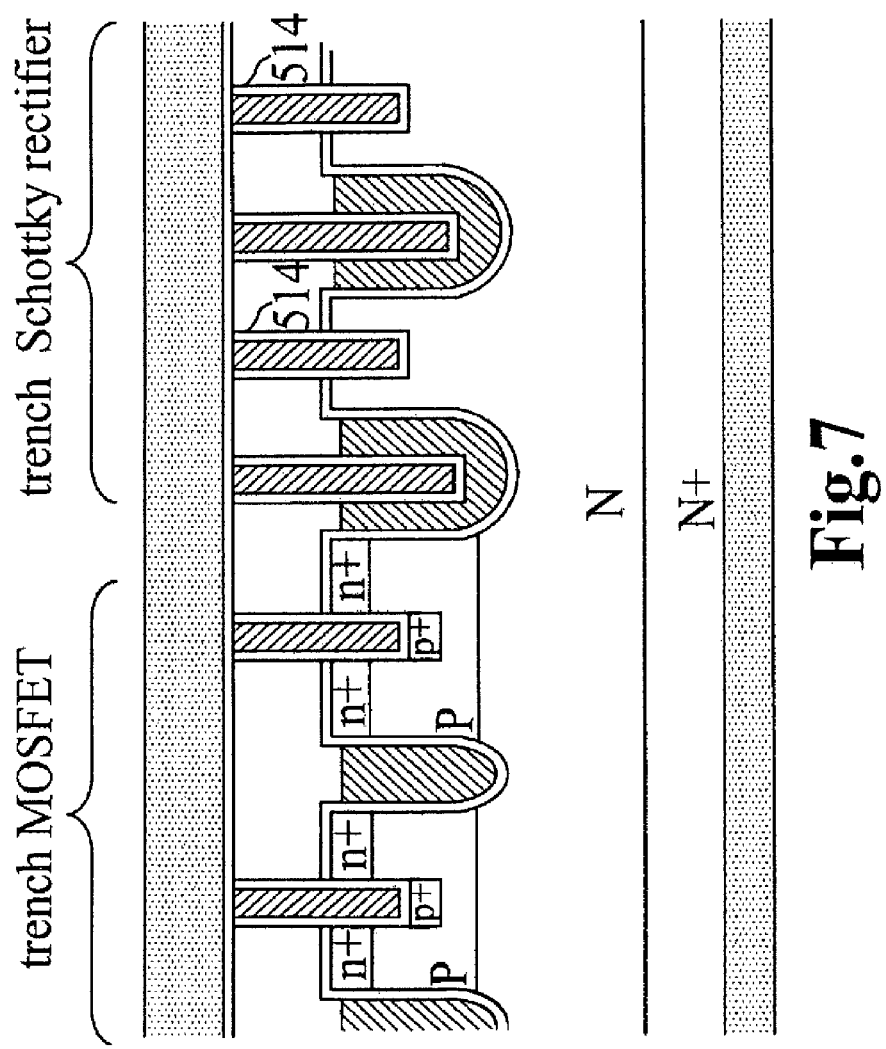
FIG. 7 is a side cross-sectional view of another preferred embodiment according to the present invention.

Please refer to FIG. 7 for a cross-sectional view of another preferred N-channel integrated circuit which is similar to that in FIG. 3 except that, there is no p+ body contact region underneath the trenched Schottky anode contacts 514.

Figure 8:
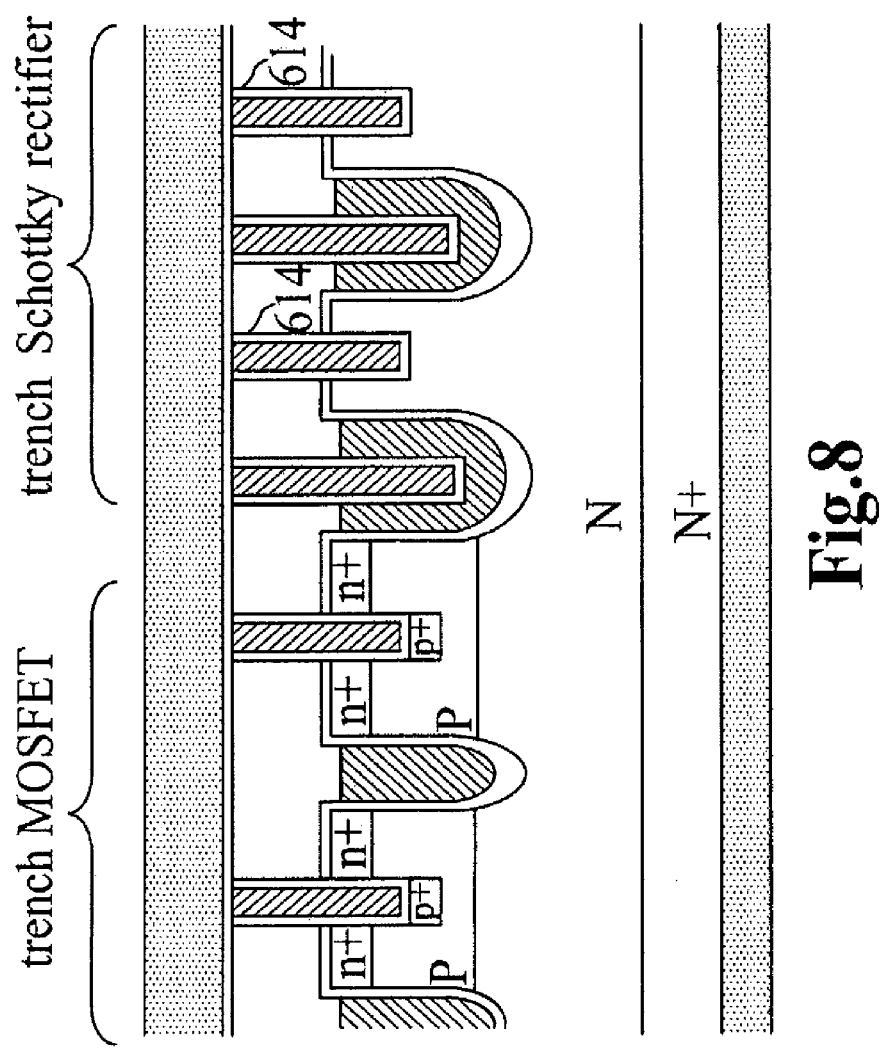
FIG. 8 is a side cross-sectional view of another preferred embodiment according to the present invention.

Please refer to FIG. 8 for a cross-sectional view of another preferred N-channel integrated circuit which is similar to that in FIG. 4 except that, there is no p+ body contact region underneath the trenched anode contacts 614.

Figure 9:
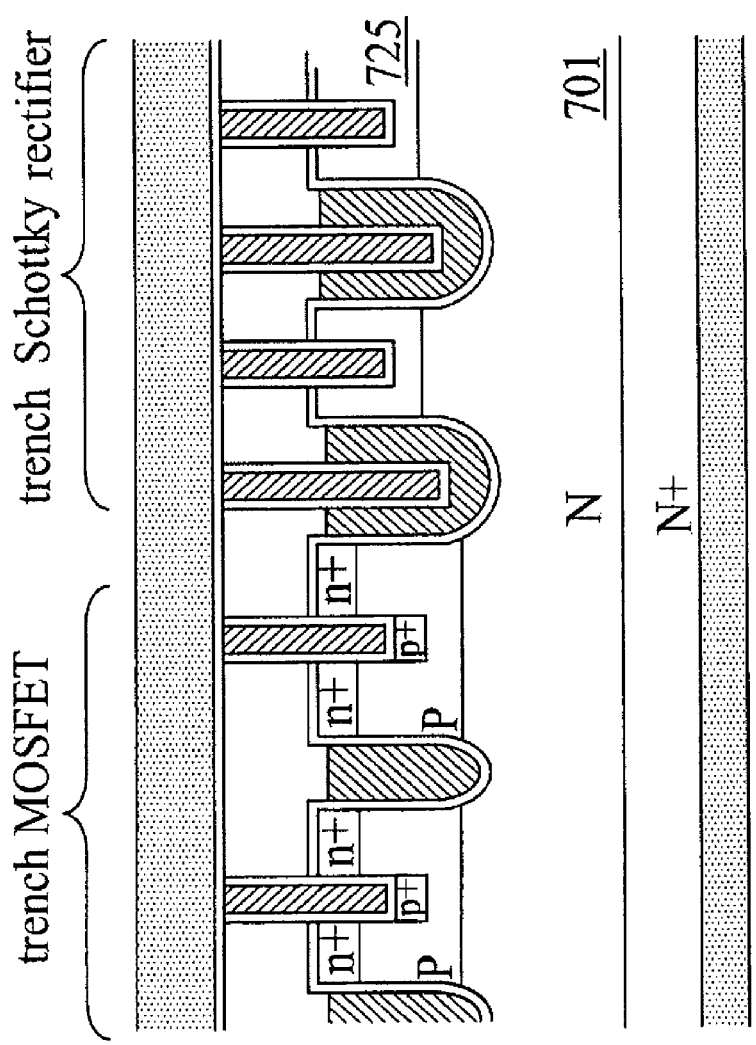
FIG. 9 is a side cross-sectional view of another preferred embodiment according to the present invention.

Please refer to FIG. 9 for a cross-sectional view of another preferred N-channel integrated circuit which is similar to that in FIG. 7 except that, the trenched Schottky anode contacts are disposed in a second N epitaxial layer 725 in upper portion of the epitaxial layer 701 within the trench Schottky rectifier portion to optimize Vf and reverse leakage current for trench Schottky rectifier. Meanwhile, said second N epitaxial layer 725 has a lower doping concentration than said epitaxial layer 701. Alternatively, said trenched Schottky anode contacts are disposed in a counter doping region 725 in upper portion of said epitaxial layer having doping concentration less than the lower portion, formed by ion implantation of a dopant into said epitaxial layer having opposite conductivity to said epitaxial layer.

Figure 10:
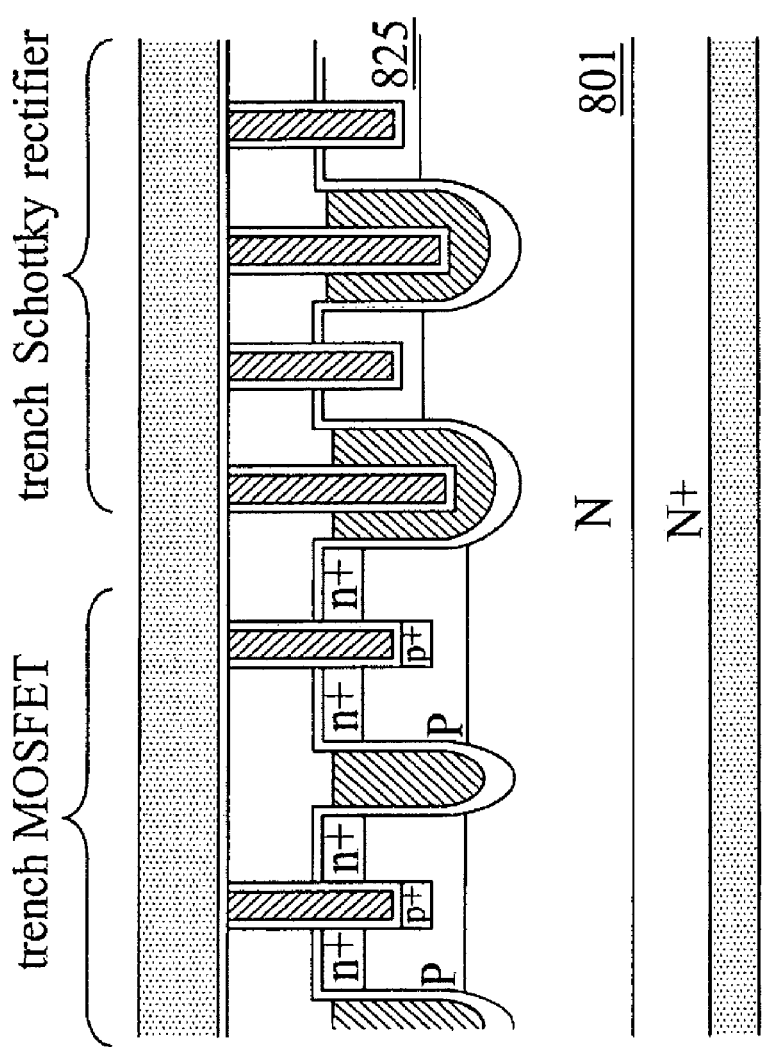
FIG. 10 is a side cross-sectional view of another preferred embodiment according to the present invention.

Please refer to FIG. 10 for a cross-sectional view of another preferred N-channel integrated circuit which is similar to that in FIG. 9 except that, the gate oxide layer 804' in FIG. 10 has greater thickness along the bottom of each trenched gate than along the sidewall to achieve a lower gate charge.

Figure 11:
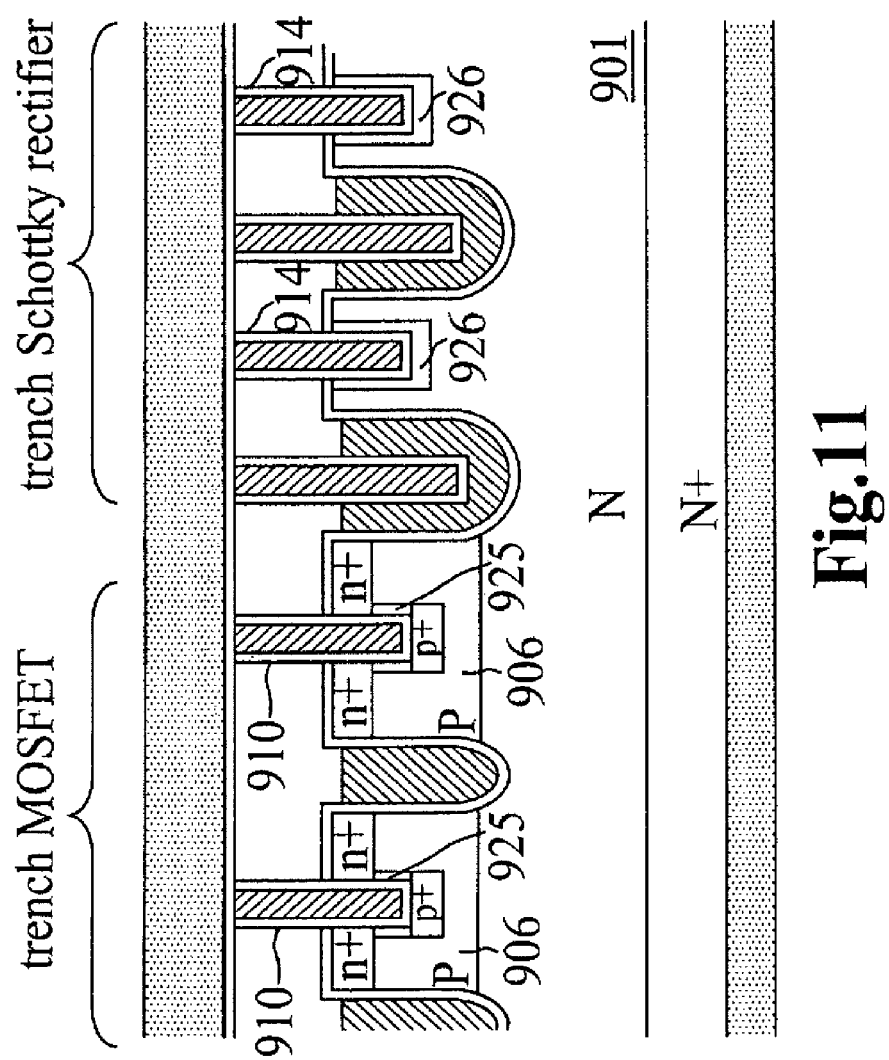
FIG. 11 is a side cross-sectional view of another preferred embodiment according to the present invention.

Please refer to FIG. 11 for a cross-sectional view of another preferred N-channel integrated circuit which is similar to that in FIG. 7 except having a Schottky barrier height enhancement region 926 of n− type in trenched Schottky rectifier and an avalanche enhancement region 925 of p* in said trench MOSFET. In the trench MOSFET portion, an avalanche enhancement region 925 encompasses the sidewall of each said trenched source-body contact 910 in the P body regions 906, having same conductivity type as said body region but having doping concentration higher than said body region 906; in the trench Schottky rectifier portion, said Schottky barrier height enhancement region 926 wraps the sidewall and the bottom of each said trenched anode contact 914 in the epitaxial layer 901, having doping concentration lower than said epitaxial layer.

Figure 12A:
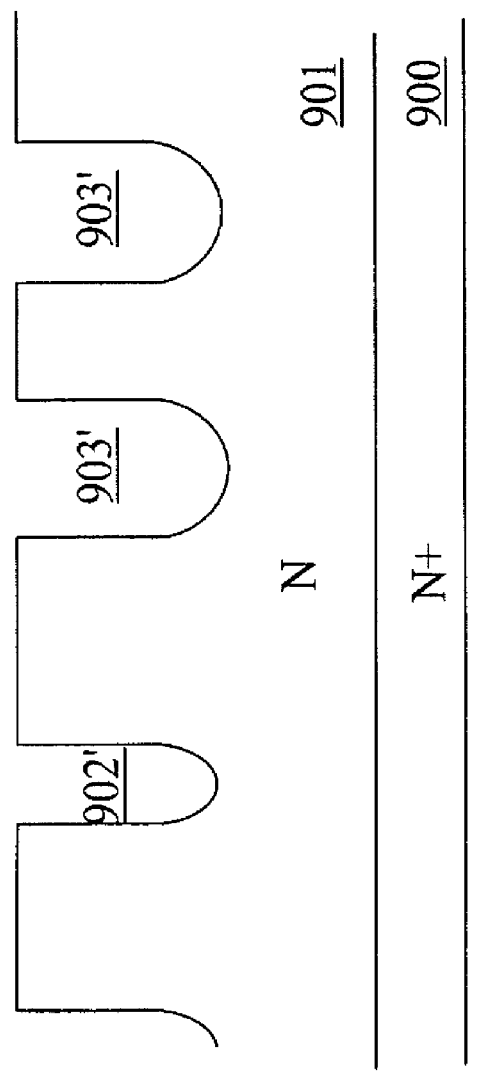
Figure 12B:
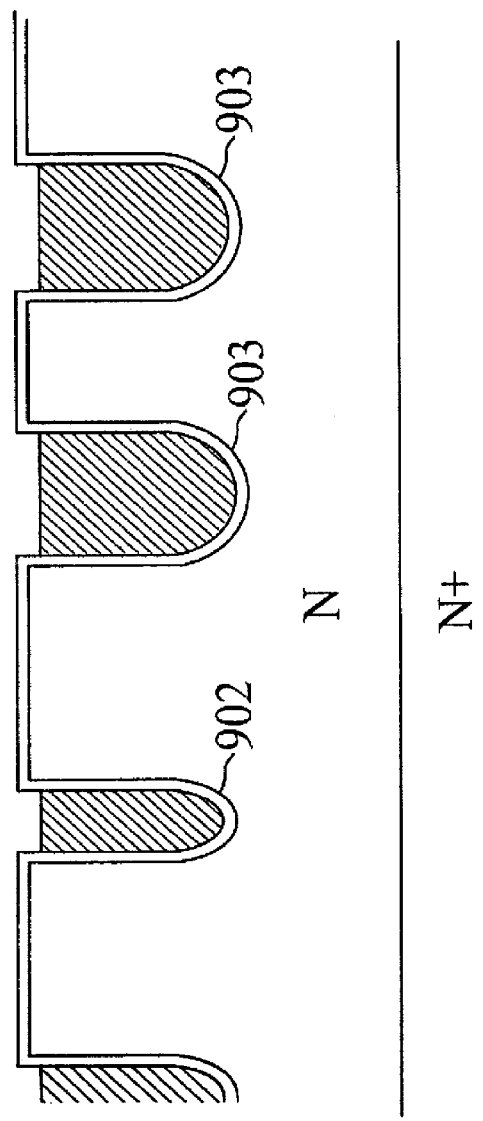

FIGS. 12A to 12F are a serial of exemplary steps that are performed to form the preferred N-channel integrated circuit in FIG. 11. In FIG. 12A, an N doped epitaxial layer 901 is first grown on an N+ substrate 900. After applying a trench mask (not shown), a plurality of first gate trenches 902' and a plurality of second gate trenches 903' are etched to a certain depth into said N epitaxial layer 901. Said second gate trench 903' has a wider trench width than said first gate trench 902'. In FIG. 12B, a sacrificial oxide layer is grown and then removed to eliminate the plasma damage may introduced during etching process. Next, a first insulation layer is deposited overlying the inner surface of said first gate trenches and said second gate trenches to serve as gate oxide 904, onto which doped poly-silicon is deposited filling all gate trenches and then etched back by CMP (Chemical Mechanical Polishing) or plasma etching to form a plurality of first trenched gates 902 and a plurality of second trenched gates 903.

In FIG. 12C, after applying a body mask (not shown), a step of P body dopant ion implantation is carried out for the formation of P body regions 906 followed by a P body dopant diffusion for drive-in. After that, a source mask (not shown) is applied and a step of n+ source dopant ion implantation is carried out for the formation of n+ source regions 908 followed by an source dopant diffusion for drive-in.

Figure 12D:
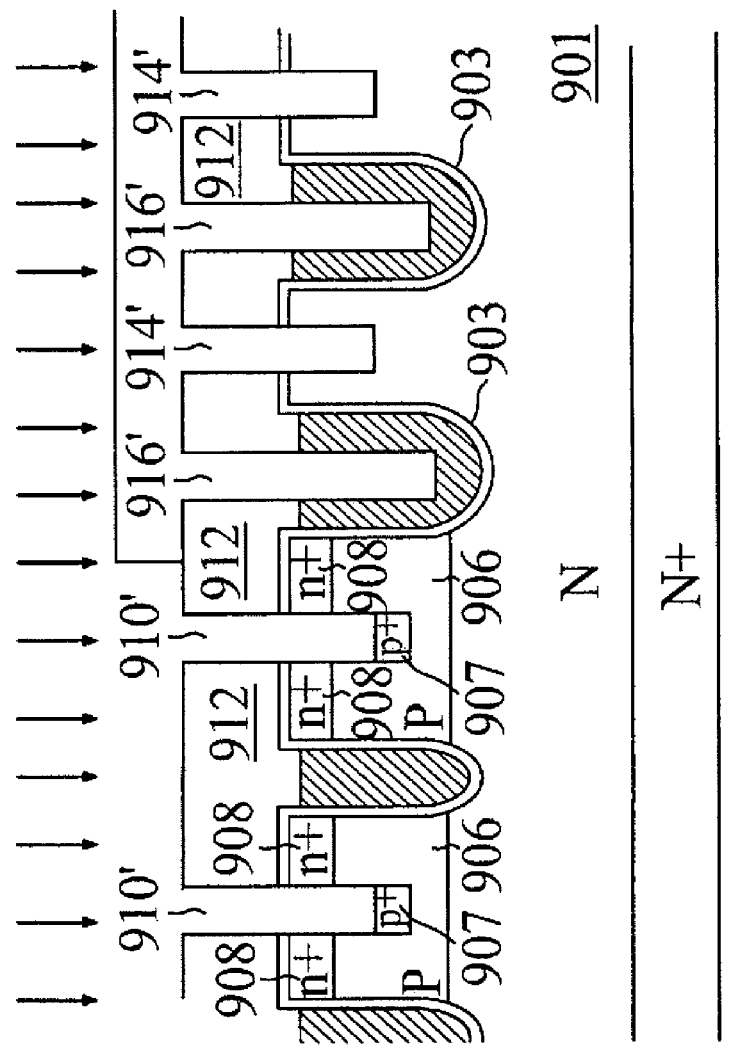

In FIG. 12D, an oxide layer is deposited onto top surface of said epitaxial layer to serve as contact interlayer 912. Then, after a contact mask (not shown) is applied, a plurality of contact trenches are etched by successively dry oxide etch and dry silicon etch, among those contact trenches comprises: a plurality of source-body contact trenches 910' penetrating through said contact interlayer 912, said n+ source regions 908 and extending into said P body regions 906; a plurality of anode contact trenches 914' penetrating through said contact interlayer 912 and extending into said epitaxial layer 901 between every two adjacent of said second trenched gates 903; a plurality of gate contact trenches 916' penetrating through said contact interlayer 912 and extending into said second trenched gates 903. Next, a p+ body contact mask is applied and a p type dopant ion implantation is carried out to form p+ body contact regions 907 underneath the bottom of each said source-body contact trench 910'.

Figure 12E:
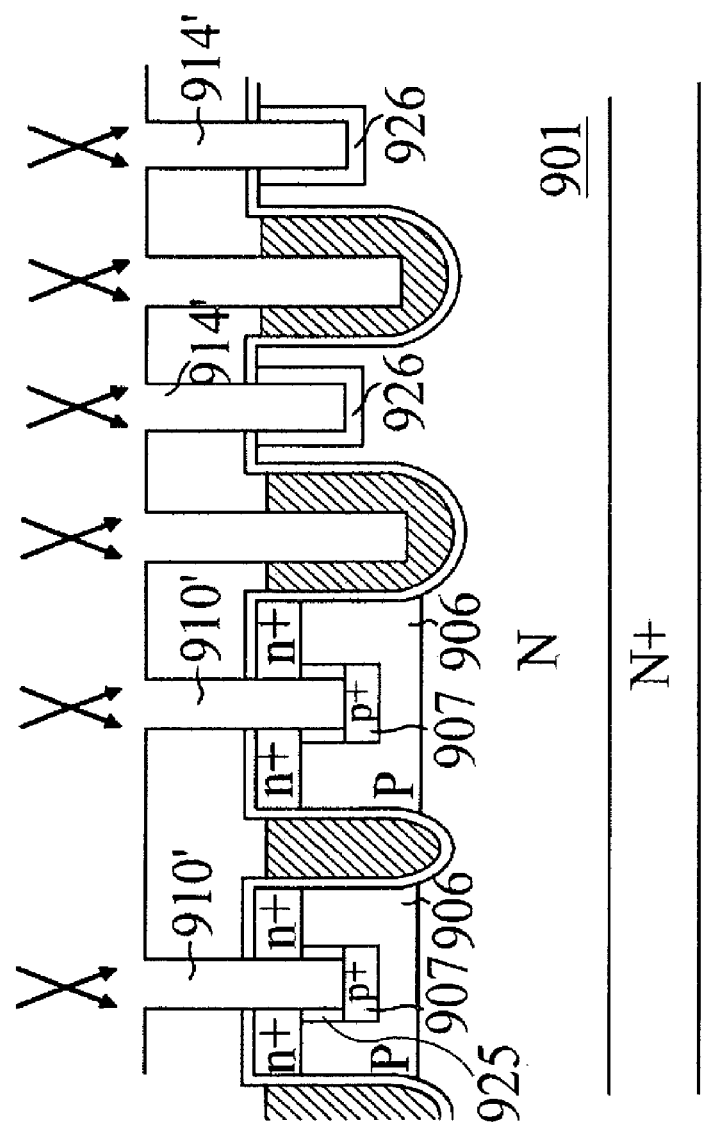

In FIG. 12E, after removing the p+ contact mask, angle BF2 ion implantations (4~30 degree) with respect to a vertical line perpendicular to top surface of said epitaxial layer, or combination of a zero degree BF2 ion implantation and said angle BF2 ion implantation, is performed to simultaneously form the Schottky barrier height enhancement region wrapping the sidewall and bottom of each said Schottky anode contact trench 914' in said epitaxial layer 901 and the avalanche enhancement region surrounding the sidewall of each said source-body contact trench 910' in P body region 906.

Figure 12F:
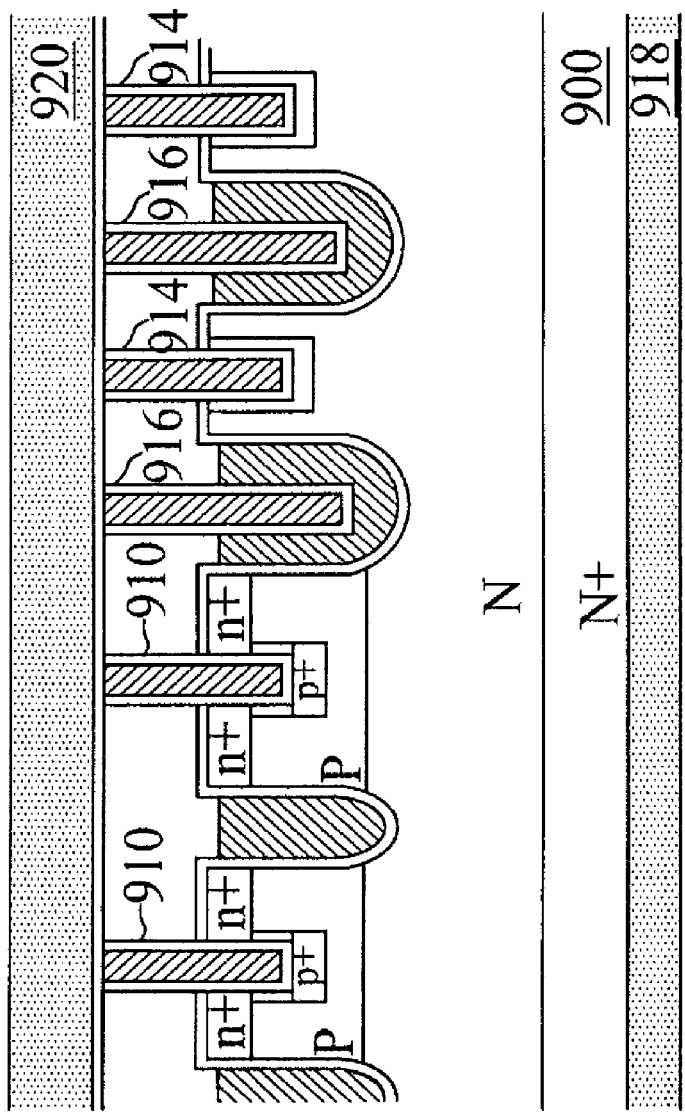

In FIG. 12F, a barrier layer of Ti/TiN or Co/TiN or Ta/TiN and contact filling-in material tungsten is successively deposited and then etched back to trenched source-body contacts 910, trenched anode contacts 914 and trenched gate contacts 916. Then, a metal layer of Al alloys or Cu alloys is deposited over a resistance-reduction layer of Ti or Ti/TiN and patterned to form source metal 920. Last, after the backside grinding, drain metal 918 of Ti/Ni/Ag is deposited onto the rear side of said substrate 900.

In FIG. 16D, wet etching in dilute HF is first carried out to enlarge the contact width in BPSG or PSG layer 330-2. Then, a barrier layer 316 of Ti/TiN or Co/TiN or Ta/TiN and contact filling-in material W is successively deposited and then etched back to form W plugs 315 in trenched source-body contacts, W plug 319 in trenched gate contact and W plug 321 extending into said fourth trenched gate 326. Then, a metal layer of Al alloys or Cu alloys is deposited after Ti or Co silicide formation by RTA (Rapid Thermal Anneal), over a resistance-reduction layer of Ti or Ti/TiN and patterned by a metal mask (not shown) to form source metal 340 and gate metal 342 by metal etching. Last, after the backside grinding, back metal 390 of Ti/Ni/Ag is deposited onto the rear side of said substrate 300.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A method for manufacturing an integrated circuit comprising a pair of trench MOSFET and trench Schottky rectifier horizontally disposed in two different areas in said integrated circuit, comprising the steps of;

growing an epitaxial layer with a first conductivity type upon a heavily doped substrate with said first conductivity type;

etching a plurality of first gate trenches in said trench MOSFET, and a plurality of second gate trenches in said trench Schottky rectifier after applying a trench mask;

refilling said first and second gate trenches with a doped poly-silicon layer padded by a gate oxide layer;

applying a body mask and carrying out ion implantation with a second conductivity type dopant and then diffusing it to form body regions;

applying a source mask and carrying out ion implantation with said first conductivity type dopant to form source regions with heavier doping concentration than said epitaxial layer;

forming an insulation layer covering top surface of said trench MOSFET and said trench Schottky rectifier;

applying a contact mask onto said insulation layer;

etching a plurality of contact trenches by successively dry oxide etching and dry silicon etching, wherein said contact trenches include: a plurality of source-body contact trenches penetrating through said insulation layer, said source regions and extending into said body regions; and a plurality of anode contact trenches penetrating through said insulation layer and extending into said epitaxial layer;

forming a body contact region of said second conductivity type with heavier doping concentration than said body regions underneath bottom of each of said source-body contact trenches;

and carrying out ion implantation with said second conductivity dopant to form an avalanche enhancement region wrapping sidewall of each of said source-body contact trenches in said trench MOSFET within said body regions, and a Schottky barrier enhancement region wrapping sidewall and bottom of each of said anode contact trenches in said trench Schottky rectifier within said epitaxial layer.

2. The method of claim 1, wherein said Schottky barrier height enhancement region is of said first conductivity type and has a lower doping concentration than said epitaxial layer.

3. The method of claim 1, wherein said avalanche enhancement region is of said second conductivity type and has a higher doping concentration than said body region.

4. The method of claim 1, further comprising activating the dopant of said body contact region and said Schottky barrier enhancement region.

5. The method of claim 4, wherein activating step further comprises carrying out rapid thermal annealing.

6. The method of claim 1 further comprising:
   forming tungsten plugs within said source-body contact trenches and said anode contact trenches;
   depositing a front metal of Al alloys or Cu alloys.

7. The method of claim 6 wherein said tungsten plugs are padded by a barrier layer of Ti/TiN or Co/TiN or Ta/TiN.

8. The method of claim 1 further comprises grinding the backside of said substrate and depositing a back metal of Ti/Ni/Ag whereion.

9. The method of claim 1, wherein carrying out ion implantation to form said avalanche enhancement region and said Schottky barrier enhancement region comprises carrying out angle ion implantation or carrying out a combination of angle ion implantation and a vertical ion implantation.

10. The method of claim 9, wherein said angle ion implantation is carried out with angle of 4~30 degree with respect to a vertical line perpendicular to top surface of said epitaxial layer.

11. The method of claim 1, wherein forming said body contact region further comprising: applying a body contact mask to cover said trench Schottky rectifier and carrying out ion implantation of zero degree with said second conductivity type dopant; and removing away said body contact mask.

\* \* \* \* \*